United States Patent
Kim et al.

(10) Patent No.: US 12,082,458 B2
(45) Date of Patent: Sep. 3, 2024

(54) DISPLAY DEVICE HAVING A CONDUCTIVE LAYER OF A SAME MATERIAL AS THE PIXEL ELECTRODE COVERING ONE SIDE SURFACE OF A POWER SUPPLY LINE FORMED UNDER A SEALING PORTION BETWEEN TWO SUBSTRATES

(71) Applicant: SAMSUNG DISPLAY CO., LTD., Yongin-si (KR)

(72) Inventors: Dongjo Kim, Yongin-si (KR); Danbi Choi, Yongin-si (KR); Soukjune Hwang, Yongin-si (KR)

(73) Assignee: SAMSUNG DISPLAY CO., LTD, Yongin-si (KR)

( * ) Notice: Subject to any disclaimer, the term of this patent is extended or adjusted under 35 U.S.C. 154(b) by 411 days.

(21) Appl. No.: 16/991,314

(22) Filed: Aug. 12, 2020

(65) Prior Publication Data
US 2021/0202652 A1 Jul. 1, 2021

(30) Foreign Application Priority Data
Dec. 30, 2019 (KR) .......................... 10-2019-0178148

(51) Int. Cl.
| | |
|---|---|
| *H01L 27/32* | (2006.01) |
| *H10K 59/121* | (2023.01) |
| *H10K 59/122* | (2023.01) |
| *H10K 59/123* | (2023.01) |
| *H10K 59/131* | (2023.01) |

(52) U.S. Cl.
CPC ....... *H10K 59/131* (2023.02); *H10K 59/1213* (2023.02); *H10K 59/122* (2023.02); *H10K 59/123* (2023.02)

(58) Field of Classification Search
CPC ............. H01L 27/3246; H01L 27/3248; H01L 27/3262; H01L 27/3276; H01L 51/523
See application file for complete search history.

(56) References Cited

U.S. PATENT DOCUMENTS

| | | | |
|---|---|---|---|
| 6,424,401 B1 | 7/2002 | Kang et al. | |
| 7,433,010 B2 | 10/2008 | Lim | |
| 7,597,603 B2 | 10/2009 | Becken et al. | |
| 9,219,244 B2* | 12/2015 | Lee | H01L 29/786 |
| 9,954,197 B2 | 4/2018 | Kim | |
| 2005/0195355 A1* | 9/2005 | Kwak | H01L 51/5246 349/149 |

(Continued)

FOREIGN PATENT DOCUMENTS

| | | |
|---|---|---|
| KR | 10-0652049 | 11/2006 |
| KR | 10-2015-0069701 | 6/2015 |

(Continued)

*Primary Examiner* — Anh D Mai
(74) *Attorney, Agent, or Firm* — F. Chau & Associates, LLC

(57) ABSTRACT

A display device includes: a first substrate having a display area and a non-display area on one side of the display area; a second substrate arranged opposite the first substrate; a display element arranged on the display area, the display element including a pixel electrode, an intermediate layer arranged on the pixel electrode, and an opposite electrode arranged on the intermediate layer; a power supply line arranged on the non-display area; and a conductive layer arranged on the power supply line and including the same material as the pixel electrode.

14 Claims, 12 Drawing Sheets

(56) References Cited

U.S. PATENT DOCUMENTS

2016/0013441 A1* 1/2016 Hong .................. H01L 27/3276
 257/40
2019/0043420 A1* 2/2019 Jung .................. H01L 27/3234

FOREIGN PATENT DOCUMENTS

| KR | 10-2019-0092581 | 8/2019 |
| KR | 10-0335462 | 5/2020 |

* cited by examiner

DISPLAY DEVICE HAVING A CONDUCTIVE LAYER OF A SAME MATERIAL AS THE PIXEL ELECTRODE COVERING ONE SIDE SURFACE OF A POWER SUPPLY LINE FORMED UNDER A SEALING PORTION BETWEEN TWO SUBSTRATES

CROSS-REFERENCE TO RELATED APPLICATION

This application claims priority under 35 U.S.C. § 119 to Korean Patent Application No. 10-2019-0178148, filed on Dec. 30, 2019 in the Korean Intellectual Property Office, the disclosure of which is incorporated herein by reference in its entirety.

FIELD

The present disclosure relates to a display device, and more particularly, to a display device having improved reliability.

DISCUSSION OF RELATED ART

In recent years, display devices have been used in a variety of applications, and because the display devices have become thinner and lighter, the range of their use is increasing.

In a display device, a thin film transistor and display elements, such as organic light-emitting diodes, may be formed on a first substrate, and the display elements may emit light. The display device may be used as a display unit of a small product such as a mobile phone, or may be used as a display unit of a large product such as a television.

In the display device, the first substrate on which the thin film transistor and the display elements are arranged, and a second substrate, may be bonded to each other, and then the thin film transistor and the display elements may be sealed by irradiation with a laser, thereby preventing the display elements such as organic light-emitting diodes from being exposed to external air and moisture. When display elements such as organic light-emitting diodes are sealed by laser irradiation, a short-circuit or like fault may occur if, for example, a lower metal line is damaged by heat.

SUMMARY

An exemplary embodiment of the present disclosure may include a display device configured to prevent a short-circuit or like fault from occurring between adjacent wirings. This embodiment is merely an example, and the present disclosure is not limited thereto.

According to an exemplary embodiment, a display device includes: a first substrate having a display area and a non-display area on one side of the display area; a second substrate arranged opposite the first substrate; a display element arranged on the display area, the display element including a pixel electrode, an intermediate layer arranged on the pixel electrode, and an opposite electrode arranged on the intermediate layer; a power supply line arranged on the non-display area; and a conductive layer arranged on the power supply line and including the same material as the pixel electrode.

The power supply line may include a first power supply line and a second power supply line spaced apart from the first power supply line, wherein the conductive layer may be arranged on the second power supply line. The conductive layer may be arranged directly on the second power supply line. The conductive layer may clad an upper surface and both side surfaces of the second power supply line.

The display device may further include a sealing portion that bonds the first substrate and the second substrate to each other, the sealing portion being arranged in the non-display area to surround a periphery of the display area. The sealing portion may at least partially overlap the second power supply line. The sealing portion may directly contact the conductive layer. The power supply line may include at least one of molybdenum (Mo), aluminum (Al), copper (Cu), and titanium (Ti).

The conductive layer may include at least one of silver (Ag), magnesium (Mg), aluminum (Al), platinum (Pt), palladium (Pd), gold (Au), nickel (Ni), neodymium (Nd), iridium (Ir), and chromium (Cr). The conductive layer may include at least one of indium tin oxide (ITO), indium zinc oxide (IZO), zinc oxide (ZnO), indium oxide ($In_2O_3$), indium gallium oxide (IGO), and aluminum zinc oxide (AZO). The conductive layer may have a stacked structure of ITO/Ag/ITO. The conductive layer may clad at least a portion of an upper surface of the second power supply line and both side surfaces of the second power supply line.

The conductive layer may include an opening that exposes at least a portion of the upper surface of the second power supply line. The conductive layer may clad at least a portion of an upper surface of the second power supply line and a side surface adjacent to the first power supply line.

According to an exemplary embodiment, a display device includes: a first substrate having a display area and a non-display area on one side of the display area; a second substrate arranged opposite the first substrate; a display element arranged on the display area, the display element including a pixel electrode, an intermediate layer arranged on the pixel electrode, and an opposite electrode arranged on the intermediate layer; a power supply line arranged on the non-display area, the power supply line including a first power supply line and a second power supply line spaced apart from the first power supply line; a conductive layer arranged on the second power supply line and including the same material as the pixel electrode; and a sealing portion that bonds the first substrate and the second substrate to each other, the sealing portion being arranged in the non-display area to surround a periphery of the display area.

The conductive layer may clad an upper surface and both side surfaces of the second power supply line. The sealing portion may at least partially overlap the second power supply line. The sealing portion may directly contact the conductive layer. The power supply line may include at least one of Mo, Al, Cu, and Ti. The conductive layer may have a stacked structure of ITO/Ag/ITO.

According to an exemplary embodiment, a display panel includes: a substrate having a display area and a non-display area disposed adjacent to the display area; a seal disposed on the non-display area; a first conductive line disposed on the substrate and having a first portion adjacent to the seal; a second conductive line disposed on the substrate and having a second portion under the seal; and a conductive layer disposed on at least one surface of the second portion where the first portion is adjacent to the second portion.

The conductive layer may be disposed on a first surface of the second portion that faces towards the first portion. The conductive layer may be disposed on a second surface of the second portion that faces away from the first portion.

The display panel may include: a second substrate arranged opposite to the substrate and disposed on the seal, wherein the conductive layer is further disposed on a third surface of the second portion that faces towards the second substrate. The conductive layer may include a plurality of conductive sub-layers, and the seal may include a laser-curable material bonding the substrate and at least one of the second conductive line or one of the plurality of conductive sub-layers to the second substrate.

BRIEF DESCRIPTION OF THE DRAWINGS

The above and other aspects of the disclosure will be more apparent from the following description of exemplary embodiments when taken in conjunction with the accompanying drawings, in which.

DETAILED DESCRIPTION

Figure 1:
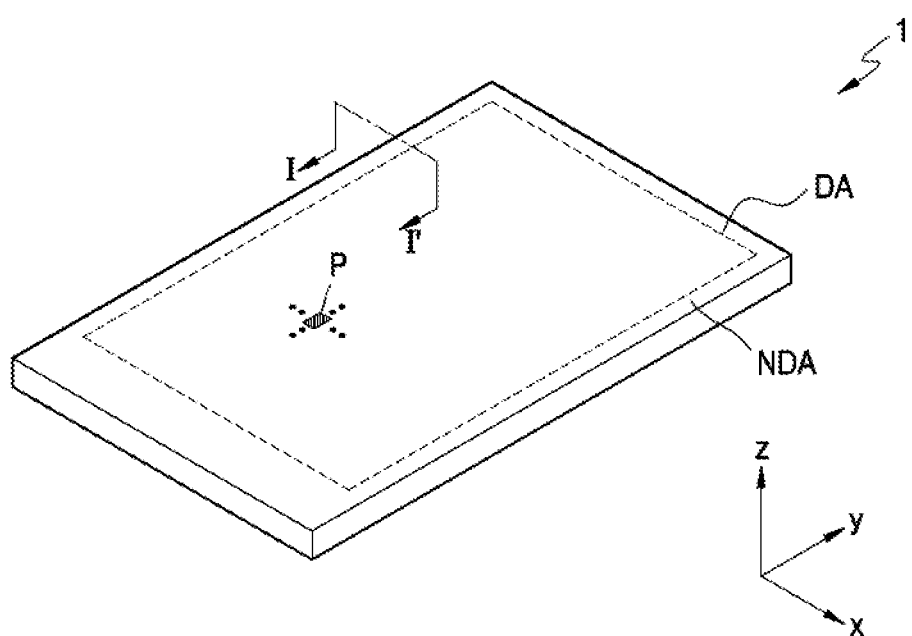
FIG. 1 is a perspective view schematically illustrating a display device according to an exemplary embodiment.

Exemplary embodiments of the present disclosure will be described below in greater detail, wherein like reference numerals may refer to like elements throughout. In this regard, it shall be understood that the presently described exemplary embodiments are merely descriptive, and may, in practice, take different forms and so should not be construed as being limited to the particular descriptions set forth herein.

FIG. 1 illustrates a display device 1 according to an exemplary embodiment. Referring to FIG. 1, the display device 1 includes a display area DA that outputs an image and a non-display area NDA that does not output an image. For example, the non-display area NDA may be provided at one side of the display area DA. The display device 1 may provide an image to the outside by using light emitted from the display area DA.

Although FIG. 1 illustrates a display device 1 in which a display area DA is tetragonal, the disclosure is not limited thereto. The shape of the display area DA may be a circle, an ellipse, or a polygon such as a triangle or a pentagon. In addition, although the display device 1 of FIG. 1 is shown as a flat display device having a flat shape, the display device 1 may be implemented in various forms such as a flexible display device, a foldable display device, a rollable display device, or the like.

Figure 2:
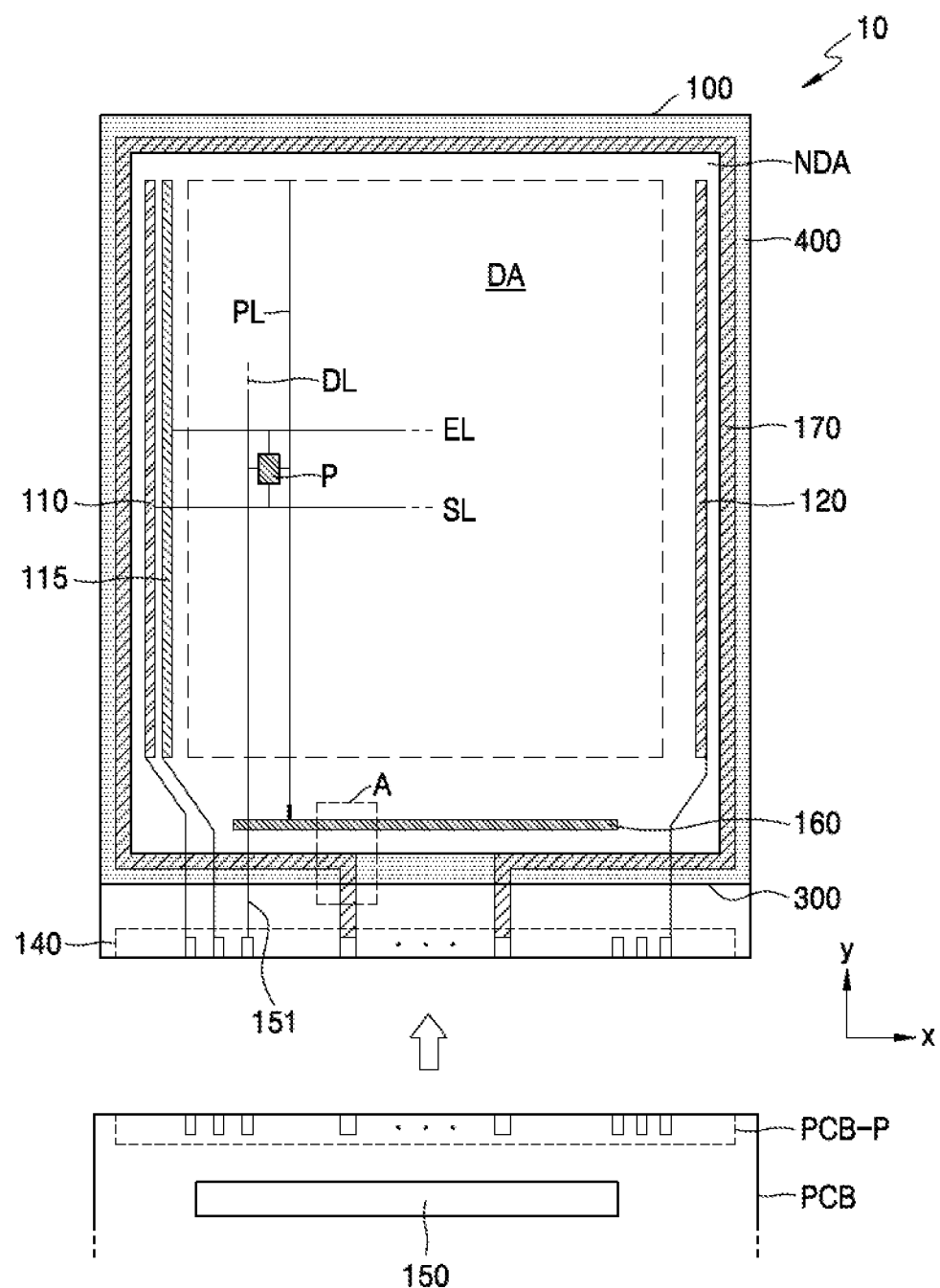
FIG. 2 is a plan view schematically illustrating a display panel according to an exemplary embodiment.

The display device 1 may include a component positioned on one side of a display panel 10 of FIG. 2. The component may be an electronic element using light or sound. For example, the electronic element may be a sensor, such as an infrared sensor, which receives and uses light, a camera that receives light to capture an image, a sensor that outputs and detects light or sound to measure a distance or recognizes a fingerprint, a small lamp that outputs light, a speaker that outputs sound, or the like.

Hereinafter, although an organic light-emitting display device is described as an example of the display device 1 according to an exemplary embodiment, the display device 1 is not limited thereto. In an alternate embodiment, the display device 1 may be an inorganic light-emitting display device, an inorganic electroluminescence (EL) display device, a quantum dot light-emitting display device, or the like. For example, an emission layer of a display element provided in the display device 1 may include an organic material, may include an inorganic material, may include quantum dots, may include an organic material and quantum dots, or may include an inorganic material and quantum dots, or a combination thereof.

FIG. 2 illustrates a display panel 10 according to an exemplary embodiment. Referring to FIG. 2, the display device 1 of FIG. 1 includes the display panel 10. A plurality of pixels P are arranged in a display area DA of a first substrate 100. The plurality of pixels P may each include a display element such as an organic light-emitting diode. Each of the pixels P may emit, for example, red, green, blue, or white light from the organic light-emitting diode.

A second substrate 300 may be provided on the first substrate 100. The second substrate 300 may be arranged opposite the first substrate 100 with components therebetween, the components being formed on the first substrate 100.

The second substrate 300 may be bonded to the first substrate 100 through a sealing portion 400 positioned in a non-display area NDA to surround the periphery of the display area DA, and the display area DA may be sealed from the outside to prevent display elements such as organic light-emitting diodes from being exposed to external air and moisture. The sealing portion 400 may include, for example, a frit.

In an exemplary embodiment, the display area DA may be covered by a thin film encapsulation layer, instead of the second substrate 300, to be protected from external air or moisture. The thin film encapsulation layer may be integrally provided to correspond to the entire surface of the display area DA, and may be partially placed on the non-display area NDA. The thin film encapsulation layer may cover some or all of a first scan driving circuit 110, a first emission driving circuit 115, a second scan driving circuit 120, a first power supply line 160, and a second power supply line 170, as may later be described in greater detail.

Since the organic light-emitting diode has a property that is vulnerable to external factors such as moisture and oxygen, the organic light-emitting diode may be sealed to improve the reliability of the display panel 10. When the thin film encapsulation layer is provided instead of the second substrate 300, the thickness of the display panel 10 may be reduced and flexibility may be improved.

Each pixel P may be electrically connected to outer circuits arranged in the non-display area NDA. The first scan driving circuit 110, the first emission driving circuit 115, the second scan driving circuit 120, a data driving circuit 150, the first power supply line 160, and the second power supply line 170 may be arranged in the non-display area NDA.

The first scan driving circuit 110 may provide a scan signal to each pixel P via a scan line SL. The first emission driving circuit 115 may provide an emission control signal to each pixel P via an emission control line EL. The second scan driving circuit 120 may be arranged in parallel to the first scan driving circuit 110 with the display area DA therebetween. Some of the pixels P arranged in the display area DA may be electrically connected to the first scan driving circuit 110, and the rest thereof may be electrically connected to the second scan driving circuit 120. In an embodiment, a second emission driving circuit may be arranged in parallel to the first emission driving circuit 115 with the display area DA therebetween.

The first emission driving circuit 115 may be spaced apart from the first scan driving circuit 110 in the x-direction and arranged in the non-display area NDA. In an embodiment, the first emission driving circuit 115 may be arranged alternately with the first scan driving circuit 110 in the y-direction.

The terminal area 140 may be arranged on one side of the first substrate 100. The terminal area 140 need not be covered by an insulating layer but may be exposed and thus may be electrically connected to a printed circuit board PCB. A terminal PCB-P of the printed circuit board PCB may be electrically connected to the terminal area 140 of the display panel 10. The printed circuit board PCB is configured to provide signals or power of a controller to the display panel 10.

Control signals generated by the controller may be provided to each of the first scan driving circuit 110, the second scan driving circuit 120, and the first emission driving circuit 115 through the printed circuit board PCB. The controller may provide a first power supply voltage ELVDD and a second power supply voltage ELVSS to the first power supply line 160 and the second power supply line 170, respectively, via at least one connection line. The first power supply voltage ELVDD may be provided to each pixel P via a driving voltage line PL connected to the first power supply line 160, and the second power supply voltage ELVSS may be provided to an opposite electrode of each pixel P connected to the second power supply line 170.

The first power supply line 160 may include sub-lines that extend in parallel in the x direction, with the display area DA therebetween. The second power supply line 170 may partially surround the display area DA in a loop shape of which one side is open.

The data driving circuit 150 is electrically connected to a data line DL. Data signals of the data driving circuit 150 may be provided to each pixel P via a connection line 151 connected to the terminal area 140 and the data line DL connected to the connection line 151. FIG. 2 illustrates that the data driving circuit 150 is arranged on the printed circuit board PCB. However, in an embodiment, the data driving circuit 150 may be arranged on the substrate 100. For example, the data driving circuit 150 may be arranged between the terminal area 140 and the first power supply line 160.

Figure 3:
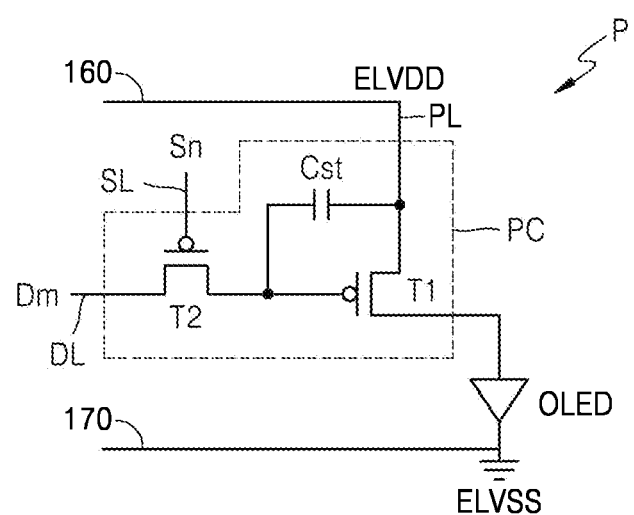
FIG. 3 is an equivalent circuit diagram of a pixel that may be included in a display device according to an exemplary embodiment.
Figure 4:
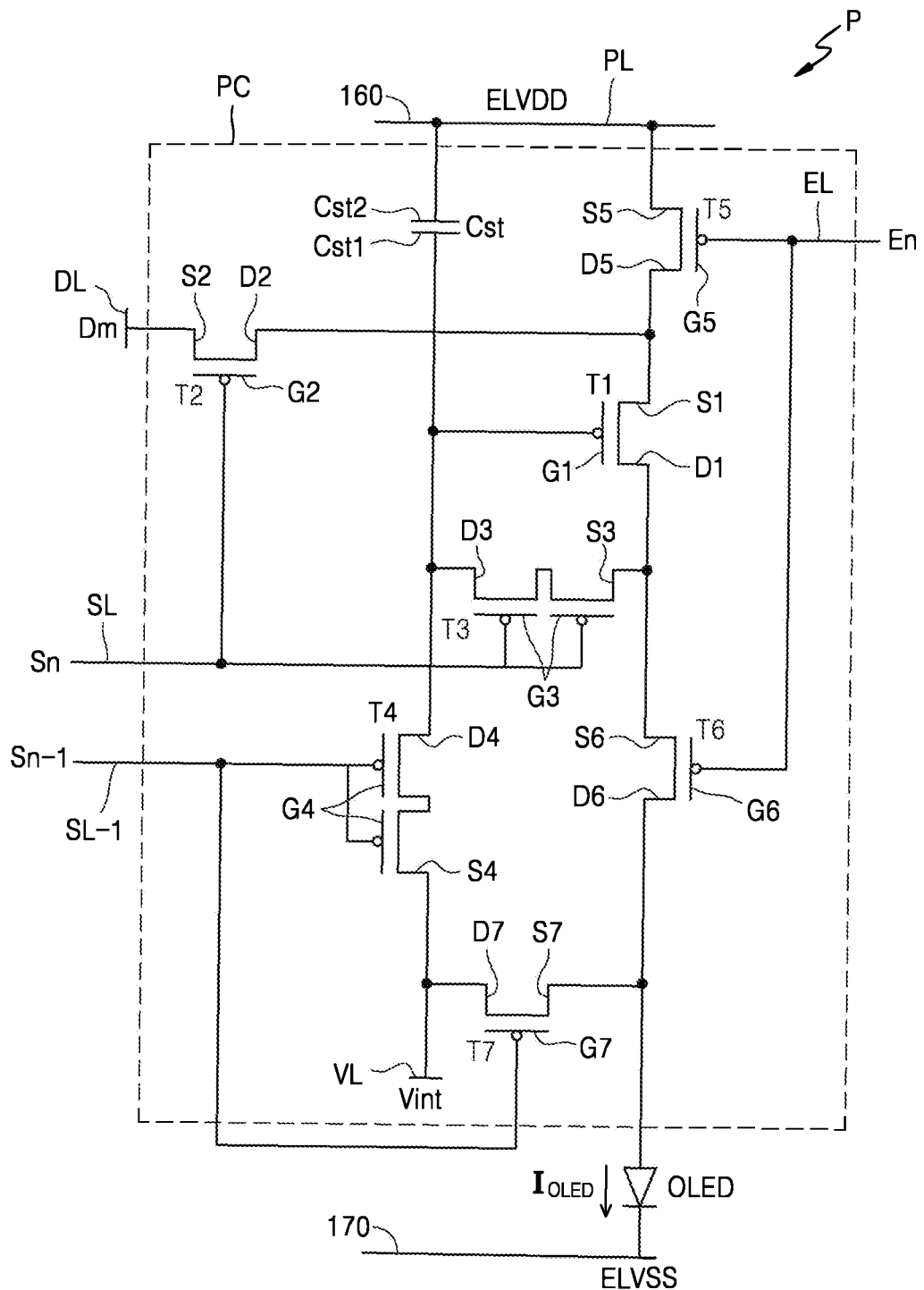
FIG. 4 is an equivalent circuit diagram of a pixel that may be included in a display device according to an embodiment.

FIGS. 3 and 4 illustrate equivalent circuits of a pixel or pixels that may be included in a display device according to an embodiment. Referring to FIG. 3, each pixel P includes a pixel circuit PC connected to a scan line SL and a data line DL, and an organic light-emitting diode OLED connected to the pixel circuit PC.

The pixel circuit PC includes a driving thin film transistor T1, a switching thin film transistor T2, and a storage capacitor Cst. The switching thin film transistor T2 is connected at a gate electrode to the scan line SL, and connected to the data line DL, and is configured to provide a data signal Dm, which is input via the data line DL according to a scan signal Sn input via the scan line SL, to a gate electrode of the driving thin film transistor T1.

The storage capacitor Cst is connected to the switching thin film transistor T2 and a driving voltage line PL and stores a voltage corresponding to a difference between the voltage received from the switching thin film transistor T2 and the driving voltage or first power supply voltage ELVDD supplied to the driving voltage line PL.

The driving thin film transistor T1 may be connected to the driving voltage line PL and the storage capacitor Cst and may control a driving current that flows through the organic light-emitting diode OLED from the driving voltage line PL in correspondence with a voltage value stored in the storage capacitor Cst. The organic light-emitting diode OLED may emit light with a certain brightness according to the driving current.

In FIG. 3, the pixel circuit PC includes two thin film transistors and one storage capacitor. However, the present disclosure is not limited thereto. As shown in FIG. 4, for example, the pixel circuit PC may include seven thin film transistors and one storage capacitor.

Referring to FIG. 4, each pixel P includes a pixel circuit PC and an organic light-emitting diode OLED connected to the pixel circuit PC. The pixel circuit PC may include a plurality of thin film transistors and a storage capacitor. The thin film transistors and the storage capacitor may be connected to signal lines SL, SL−1, EL, and DL, an initialization voltage line VL, and a driving voltage line PL.

In FIG. 4, each pixel P is connected to the signal lines SL, SL−1, EL, and DL, the initialization voltage line VL, and the driving voltage line PL. However, the present disclosure is not limited thereto. In an embodiment, at least one of the signal lines SL, SL−1, EL, and DL, the initialization voltage line VL, and the driving voltage line PL may be shared by neighboring pixels.

The plurality of thin film transistors may include a driving thin film transistor T1, a switching thin film transistor T2, a compensation thin film transistor T3, a first initialization thin film transistor T4, an operation control thin film transistor T5, an emission control thin film transistor T6, and a second initialization thin film transistor T7.

The signal lines include a scan line SL for transferring a scan signal Sn, a previous scan line SL−1 for transferring a previous scan signal Sn−1 to the first initialization thin film transistor T4 and the second initialization thin film transistor T7, an emission control line EL for transferring an emission control signal En to the operation control thin film transistor T5 and the emission control thin film transistor T6, and a data line DL that intersects with the scan line SL and is configured to transfer a data signal Dm. The driving voltage line PL is configured to transfer the driving voltage ELVDD to the driving thin film transistor T1, and the initialization voltage line VL is configured to transfer an initialization voltage Vint for initializing the driving thin film transistor T1 and a pixel electrode.

A driving gate electrode G1 of the driving thin film transistor T1 is connected to a first storage capacitor plate Cst1 of the storage capacitor Cst, a driving source electrode S1 of the driving thin film transistor T1 is connected to a lower driving voltage line, i.e., the driving voltage line PL, via the operation control thin film transistor T5, and a driving drain electrode D1 of the driving thin film transistor T1 is electrically connected to the pixel electrode of the organic light-emitting diode OLED via the emission control thin film transistor T6. The driving thin film transistor T1 receives the data signal Dm according to a switching operation of the switching thin film transistor T2 to supply a driving current $I_{OLED}$ to the organic light-emitting diode OLED.

A switching gate electrode G2 of the switching thin-film transistor T2 is connected to the scan line SL, a switching source electrode S2 of the switching thin film transistor T2 is connected to the data line DL, a switching drain electrode D2 of the switching thin film transistor T2 is connected to the driving source electrode S1 of the driving thin film transistor T1 and at the same time, is connected to the lower driving voltage line, i.e., the driving voltage line PL, via the operation control thin film transistor T5. The switching thin film transistor T2 is turned on according to the scan signal Sn received through the scan line SL and performs a switching operation for transferring the data signal Dm transferred through the data line DL to the driving source electrode S1 of the driving thin film transistor T1.

A compensation gate electrode G3 of the compensation thin film transistor T3 is connected to the scan line SL, a compensation source electrode S3 of the compensation thin film transistor T3 is connected to the driving drain electrode D1 of the driving thin film transistor T1 and at the same time is connected to the pixel electrode of the organic light-emitting diode OLED via the emission control thin film transistor T6, and a compensation drain electrode D3 of the compensation thin film transistor T3 is connected to the first storage capacitor plate Cst1 of the storage capacitor Cst, a first initialization drain electrode D4 of the first initialization thin film transistor T4, and the driving gate electrode G1 of the driving thin film transistor T1. The compensation thin film transistor T3 is turned on according to the scan signal Sn received through the scan line SL to electrically connect the driving gate electrode G1 and the driving drain electrode D1 of the driving thin film transistor T1 to each other and to diode-connect the driving thin film transistor T1.

A first initialization gate electrode G4 of the first initialization thin film transistor T4 is connected to the previous scan line SL−1, a first initialization source electrode S4 of the first initialization thin film transistor T4 is connected to a second initialization drain electrode D7 of the second initialization thin film transistor T7 and the initialization voltage line VL, and the first initialization drain electrode D4 of the first initialization thin film transistor T4 is connected to the first storage capacitor plate Cst1 of the storage capacitor Cst, the compensation drain electrode D3 of the compensation thin film transistor T3, and the driving gate electrode GE1 of the driving thin film transistor T1. The first initialization thin film transistor T4 is turned on according to a previous scan signal Sn−1 transferred through the previous scan line SL−1 to transfer the initialization voltage Vint to the driving gate electrode G1 of the driving thin film transistor T1 and perform an initialization operation for initializing a voltage at the driving gate electrode G1 of the driving thin film transistor T1.

An operation control gate electrode G5 of the operation control thin film transistor T5 is connected to the emission control line EL, an operation control source electrode S5 of the operation control thin film transistor T5 is connected to the lower driving voltage line, i.e., the driving voltage line PL, and an operation control drain electrode D5 of the operation control thin film transistor T5 is connected to the driving source electrode S1 of the driving thin film transistor T1 and the switching drain electrode D2 of the switching thin film transistor T2.

An emission control gate electrode G6 of the emission control thin film transistor T6 is connected to the emission control line EL, an emission control source electrode S6 of the emission control thin film transistor T6 is connected to the driving drain electrode D1 of the driving thin film transistor T1 and the compensation source electrode S3 of the compensation thin film transistor T3, and an emission control drain electrode D6 of the emission control thin film transistor T6 is electrically connected to a second initialization source electrode S7 of the second initialization thin film transistor T7 and the pixel electrode of the organic light-emitting diode OLED.

The operation control thin film transistor T5 and the emission control thin film transistor T6 are simultaneously turned on according to the emission control signal En transferred through the emission control line EL, and are configured to transfer the driving voltage ELVDD to the organic light-emitting diode OLED and to allow the driving current $I_{OLED}$ to flow in the organic light-emitting diode OLED.

The second initialization gate electrode G7 of the second initialization thin film transistor T7 is connected to the previous scan line SL−1, a second initialization source electrode S7 of the second initialization thin film transistor T7 is connected to the emission control drain electrode D6 of the emission control thin film transistor T6 and the pixel electrode of the organic light-emitting diode OLED, and a second initialization drain electrode D7 of the second initialization thin film transistor T7 is connected to the first initialization source electrode S4 of the first initialization thin film transistor T4 and the initialization voltage line VL. The second initialization thin film transistor T7 is turned on according to the previous scan signal Sn−1 transferred through the previous scan line SL−1 to initialize the pixel electrode of the organic light-emitting diode OLED.

FIG. 4 illustrates an example in which the first initialization thin film transistor T4 and the second initialization thin film transistor T7 are connected to the previous scan line SL−1. However, the present disclosure is not limited thereto. In an embodiment, the first initialization thin film transistor T4 may be connected to the previous scan line SL−1 to operate according to the previous scan signal Sn−1, and the second initialization thin film transistor T7 may be connected to a separate signal line (e.g., a post scan line) to operate according to a signal transferred to the separate signal line.

A second storage capacitor plate Cst2 of the storage capacitor Cst is connected to the driving voltage line PL, and an opposite electrode of the organic light-emitting diode OLED is connected to a common voltage, i.e., the second power supply voltage ELVSS. The storage capacitor may include a plurality of capacitors arranged in parallel. Accordingly, the organic light-emitting diode OLED emits light by receiving the driving current $I_{OLED}$ from the driving thin film transistor T1 to display images.

In FIG. 4, the compensation thin film transistor T3 and the first initialization thin film transistor T4 have dual-gate electrodes, but the compensation thin film transistor T3 and the first initialization thin film transistor T4 may each have one gate electrode.

Figure 5:
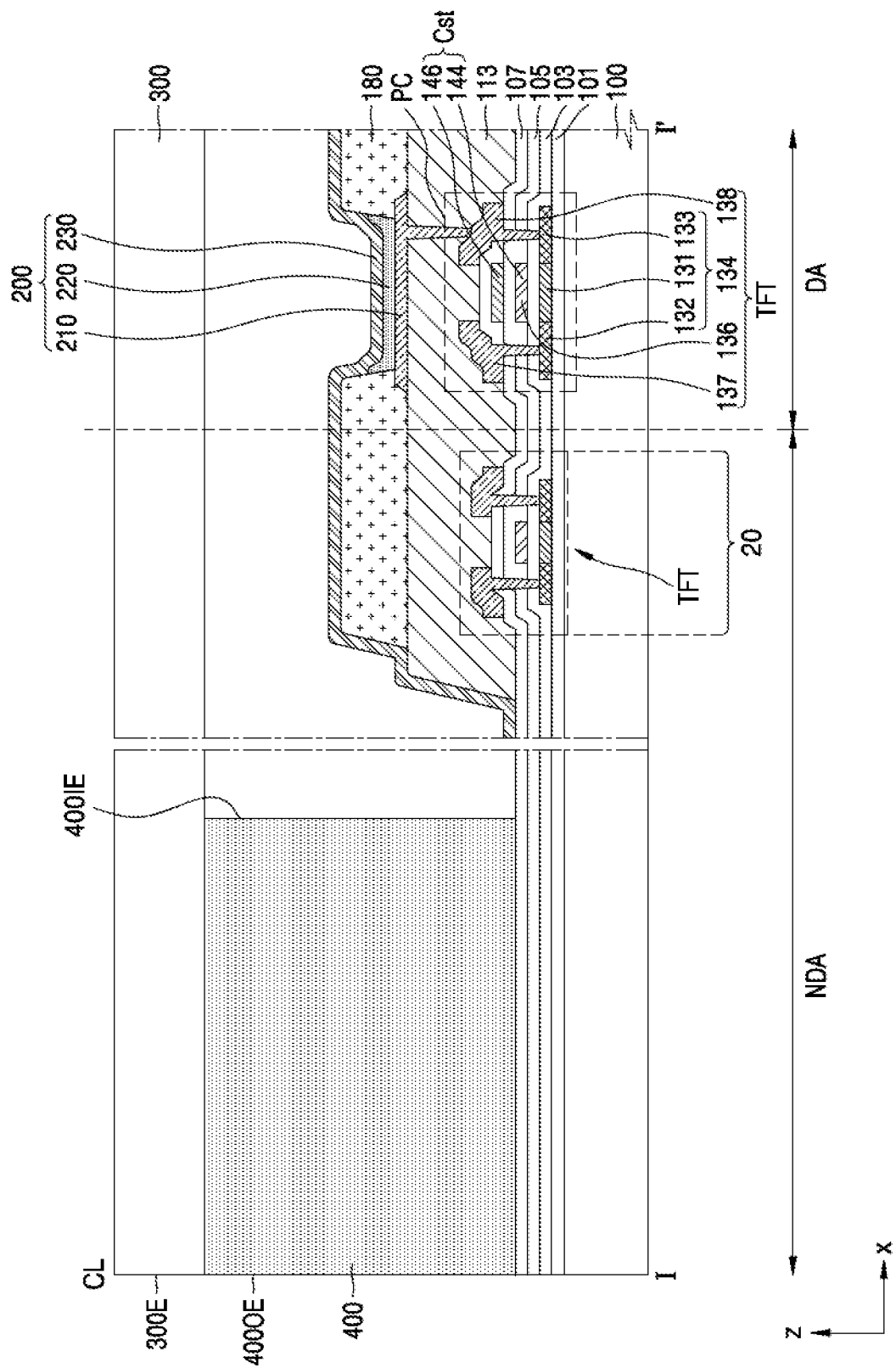
FIG. 5 is a cross-sectional view schematically illustrating a display device according to an exemplary embodiment.

FIG. 5 illustrates a display device according to an embodiment. FIG. 5 may correspond to a cross-sectional view taken along the line I-I' of FIG. 1.

Referring to FIG. 5, the display device includes a display area DA and a non-display area NDA on one side of the display area DA. A first substrate 100 and a second substrate 300 may be bonded to each other by a sealing portion 400 that surrounds the display area DA and is located in the non-display area NDA.

The first substrate 100 may include various materials, such as a glass material, a metal material, and a plastic material such as polyethylene terephthalate, polyethylene naphthalate, polyimide, or the like. The second substrate 300 may include a transparent material. For example, the second substrate 300 may include various materials, such as a glass material and a plastic material such as polyethylene terephthalate, polyethylene naphthalate, polyimide, or the like. The first substrate 100 and the second substrate 300 may include the same material or different materials.

Referring to the display area DA of FIG. 5, a buffer layer 101 may be formed on the first substrate 100. The buffer layer 101 may block foreign matter or moisture that penetrates through the first substrate 100. For example, the buffer layer 101 may include an inorganic material such as silicon oxide ($SiO_x$), silicon nitride ($SiN_x$), and/or silicon oxynitride (SiON), and may include a single layer or multiple layers.

A thin film transistor TFT, a storage capacitor Cst, and a display element 200 (e.g., the organic light-emitting diode OLED) electrically connected to the thin film transistor TFT and the storage capacitor Cst may be located on the first substrate 100 and at a position corresponding to the display area DA. The thin film transistor TFT of FIG. 5 may correspond to any one of the thin film transistors provided in the pixel circuit PC described with reference to FIG. 4, such as, for example, the driving thin film transistor T1. The storage capacitor Cst of FIG. 5 may correspond to the storage capacitor Cst described with reference to FIG. 4.

The thin film transistor TFT may include a semiconductor layer 134, a gate electrode 136, a source electrode 137, and a drain electrode 138. The semiconductor layer 134 may include, for example, polysilicon. The semiconductor layer 134 may include a channel region 131 overlapping the gate electrode 136, and a source region 132 and a drain region 133 arranged on both sides of the channel region 131 and having a higher concentration of impurities than the channel region 131. In this case, the impurities may include N-type impurities or P-type impurities. The source region 132 and the drain region 133 may be electrically connected to the source electrode 137 and the drain electrode 138 of the thin film transistor TFT, respectively.

The semiconductor layer 134 may include an oxide semiconductor and/or a silicon semiconductor. When the semiconductor layer 134 includes an oxide semiconductor, the oxide semiconductor may include an oxide of at least one material selected from, for example, indium (In), gallium (Ga), tin (Sn), zirconium (Zr), vanadium (V), hafnium (Hf), cadmium (Cd), germanium (Ge), chromium (Cr), titanium (Ti), and zinc (Zn). For example, the semiconductor layer 134 may include ITZO (InSnZnO), IGZO (InGaZnO), or the like. When the semiconductor layer 134 includes a silicon semiconductor, the silicon semiconductor may include, for example, amorphous silicon (a-Si) or low temperature polysilicon (LTPS) crystallized from amorphous silicon (a-Si).

The gate electrode 136 may have a single layer or multilayer structure including one or more metals selected from aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). The gate electrode 136 may be connected to a gate line for applying an electrical signal to the gate electrode 136.

A first insulating layer 103 may be arranged between the semiconductor layer 134 and the gate electrode 136. The first insulating layer 103 may include at least one inorganic insulating material selected from silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). The first insulating layer 103 may have a single layer or multilayer structure including the inorganic insulating material described above.

The storage capacitor Cst includes a lower electrode 144 and an upper electrode 146 overlapping each other. A second insulating layer 105 may be arranged between the lower electrode 144 and the upper electrode 146.

The second insulating layer 105 is a layer having a predetermined dielectric constant, and may be an inorganic insulating layer including SiON, $SiO_x$, and/or $SiN_x$. The second insulating layer 105 may include a single layer or multiple layers. In FIG. 5, the storage capacitor Cst overlaps the thin film transistor TFT and the lower electrode 144 is the same electrode as the gate electrode 136 of the thin film transistor TFT. However, the disclosure is not limited thereto. In another embodiment, the storage capacitor Cst does not overlap the thin film transistor TFT, and the lower electrode 144 may be an independent component different from the gate electrode 136 of the thin film transistor TFT.

The storage capacitor Cst may be covered with a third insulating layer 107. The third insulating layer 107 may be an inorganic insulating layer including SiON, $SiO_x$, and/or $SiN_x$ and may include a single layer or multiple layers.

The source electrode 137 and the drain electrode 138 may be arranged on the third insulating layer 107. Each of the source electrode 137 and the drain electrode 138 may include a conductive material including Mo, Al, Cu, Ti, or the like and may have a single layer or multilayer structure including the above material. In an embodiment, each of the source electrode 137 and the drain electrode 138 may include Al. For example, each of the source electrode 137 and the drain electrode 138 may have a multilayer structure of Ti/Al/Ti.

A planarization layer 113 may be arranged on the source electrode 137 and the drain electrode 138. The planarization layer 113 may have a contact hole, and a pixel electrode to be described later and the pixel circuit PC may be electrically connected through the contact hole.

The planarization layer 113 includes an organic insulating material. The organic insulating material may include imide-based polymer, general-purpose polymer, such as polymethylmethacrylate (PMMA) or polystyrene (PS), a polymer derivative having a phenol-based group, acryl-based polymer, aryl ether-based polymer, amide-based polymer, fluorine-based polymer, p-xylene-based polymer, vinyl alcohol-based polymer, or a blend thereof. In an embodiment, the planarization layer 113 may include polyimide (PI).

The display element 200 including a pixel electrode 210, an intermediate layer 220, and an opposite electrode 230 may be arranged on the planarization layer 113. The pixel electrode 210 may be arranged on the planarization layer 113. The pixel electrode 210 may include a (semi) transparent electrode or a reflective electrode. The pixel electrode 210 may include a reflective layer including at least one of Ag, Mg, Al, Pt, Pd, Au, Ni, Nd, Ir, and Cr, and a transparent or semi-transparent electrode layer formed on the reflective layer. The transparent or semi-transparent electrode layer may include at least one of indium tin oxide (ITO), indium zinc oxide (IZO), zinc oxide (ZnO), indium oxide ($In_2O_3$), indium gallium oxide (IGO), and aluminum zinc oxide (AZO). The pixel electrode 210 may have a stacked structure of ITO/Ag/ITO.

A pixel-defining layer 180 may be arranged on the pixel electrode 210, and the pixel defining layer 180 may have an opening corresponding to each pixel, that is, an opening for exposing at least a portion of the pixel electrode 210, to thereby define an emission region of the pixel. In addition, the pixel-defining layer 180 may increase the distance between an edge of the pixel electrode 210 and the opposite electrode 230, thereby preventing an arc or the like from occurring therebetween. The pixel-defining layer 180 may include, for example, an organic material such as polyimide or hexamethyldisiloxane (HMDSO).

The intermediate layer 220 may be arranged on the pixel electrode 210 at least partially exposed by the pixel-defining layer 180. The intermediate layer 220 may include an emission layer (EML) and may further include functional layers, such as a hole transport layer (HTL), a hole injection layer (HIL), an electron transport layer (ETL), and an electron injection layer (EIL), which are optionally arranged under and on the EML.

The EML may include an organic material including a fluorescent or phosphorescent material emitting red, green, blue, or white light. The EML may include a low molecular weight organic material or a polymer organic material. When the EML includes a low molecular weight organic material, the intermediate layer 220 may have a structure in which an HIL, an HTL, an EML, an ETL, and an EIL are stacked in a single or composite structure, and may include various organic materials, such as copper phthalocyanine (CuPc), N,N'-Di(naphthalene-1-yl)-N,N'-diphenyl-benzidine (NPB); and tris-8-hydroxyquinoline aluminum (Alq3). These layers may be formed using a method such as vacuum deposition.

When the EML includes a polymer material, the intermediate layer 220 may have a structure including an HTL and an EML. In this case, the HTL may include poly(3,4-ethylenedioxythiophene) (PEDOT), and the EML may include a polymer material, such as poly-phenylene vinylene (PPV)-based polymer or polyfluorene-based polymer. The EML may be formed using screen printing or inkjet printing, or laser induced thermal imaging (LITI). The structure of the intermediate layer 220 is not limited to the above, and the intermediate layer 220 may have various structures. For example, at least one of the layers constituting the intermediate layer 220 may be integrally formed over a plurality of pixel electrodes 210. Alternatively, the intermediate layer 220 may include a layer patterned to correspond to each of the plurality of pixel electrodes 210.

The opposite electrode 230 may be arranged above the display area DA to cover the display area DA. That is, the opposite electrode 230 may be formed as a single body to cover the plurality of pixels P. The opposite electrode 230 may include a conductive material having a low work function. For example, the opposite electrode 230 may include a (semi) transparent layer including Ag, Mg, Al, Pt, Pd, Au, Ni, Nd, Ir, Cr, Li, Ca, an alloy thereof, or the like. Alternatively, the opposite electrode 230 may further include a layer including a material, such as ITO, IZO, ZnO, or $In_2O_3$, on the transparent or semi-transparent layer including the aforementioned material.

A filler may be arranged between the opposite electrode 230 and the second substrate 300. The filler may include, for example, one or more of a photocurable epoxy material and an acrylate material. However, the disclosure is not limited thereto.

Referring to the non-display area NDA of FIG. 5, a driving circuit 20 may be arranged on the first substrate 100. For example, the driving circuit 20 may be the first scan driving circuit 110 or the first emission driving circuit 115 of FIG. 2.

The driving circuit 20 may include thin film transistors TFT and may include wiring lines connected to the thin film transistors TFT. The thin film transistors TFT of the driving circuit 20 may be formed in the same process as the thin film transistor TFT of the pixel circuit PC.

The driving circuit 20 includes an insulating layer between elements (e.g., a semiconductor layer and a gate electrode) constituting the thin film transistors TFT. For example, at least one of the buffer layer 101, the first insulating layer 103, the second insulating layer 105, and the third insulating layer 107 may extend into the non-display area NDA.

The driving circuit 20 may be arranged closer to the display area DA than the first scan driving circuit 110. Thus, as shown in FIG. 5, a portion of the planarization layer 113 may extend to the non-display area NDA and be formed on the driving circuit 20 to cover the driving circuit 20. In another embodiment, the planarization layer 113 may not cover the driving circuit 20, and only an inorganic insulating layer may be located on the driving circuit 20.

In some embodiments, the driving circuit 20 may be covered with an inorganic insulating layer. The inorganic insulating layer may prevent a conductive layer including metal (e.g., aluminum) which may be damaged by an etchant from being exposed to an etching environment in a process of manufacturing the display device. In some cases, the inorganic insulating layer may be arranged on the display area DA. The inorganic insulating layer may include an inorganic material such as $SiO_x$, $SiN_x$, or/and SiON and may include a single layer or multiple layers. The inorganic insulating layer may have a thickness of about 500 Å or more. In another embodiment, the thickness of the inorganic insulating layer may be 1,000 Å or more, 1,500 Å or more, 2,000 Å or more, 2,500 Å or more, 3,000 Å or more, 3,500 Å or more, 4,000 Å or more, 4,500 Å or more, 5,000 Å or more, 5,500 Å or more, 6,000 Å or more, or 6,500 Å or more. Alternatively, the inorganic insulating layer may have a thickness of about 7,000 Å to about 10,000 Å.

The second power supply line 170 (see FIG. 2) may be arranged in the non-display area NDA. In an embodiment, the second power supply line 170 may overlap a sealing portion 400, as shown in FIG. 2, or the second power supply line 170 may be spaced apart from the sealing portion 400. In addition, in an embodiment, the second power supply line 170 may overlap a portion of the driving circuit 20. The second power supply line 170 may include the same material as the source electrode 137 and the drain electrode 138.

The sealing portion 400 is arranged in the non-display area NDA to bond the first substrate 100 and the second substrate 300 to each other. The sealing portion 400 may be located on a stacked structure including the buffer layer 101, the first insulating layer 103, the second insulating layer 105, and the third insulating layer 107 sequentially arranged on the first substrate 100. In this case, for the adhesion between the sealing portion 400 and the first substrate 100, the buffer layer 101, the first insulating layer 103, the second insulating layer 105, and the third insulating layer 107, which are between the sealing portion 400 and the first substrate 100, may all include an inorganic insulating layer. Although it is shown in FIG. 5 that the sealing portion 400 is located on the stacked structure including the buffer layer 101, the first insulating layer 103, the second insulating layer 105, and the third insulating layer 107, some of the buffer layer 101, the first insulating layer 103, the second insulating layer 105, and the third insulating layer 107, which are between the sealing portion 400 and the first substrate 100, may be removed, and other layers may be added between the sealing portion 400 and the first substrate 100.

In an embodiment, in the display device, an outer wall 4000E of the sealing portion 400 may coincide with an edge 300E of the second substrate 300. In other words, the outer wall 4000E of the sealing portion 400 and the edge 300E of the second substrate 300 may be coplanar with each other. This is because, when the display device is manufactured by cutting a panel including the sealing portion 400, the first substrate 100, the sealing portion 400, and the second substrate 300 are cut together along a cutting line CL. However, the disclosure is not limited to the manufacturing method, and the outer wall 4000E of the sealing portion 400 may not coincide with the edge 300E of the second substrate 300.

In a direction that an inner wall 4001E of the sealing portion 400 faces, a space between structures on the first substrate 100 and the second substrate 300 may be formed in a vacuum atmosphere. In some embodiments, additional organic or inorganic functional layers may be further arranged on the opposite electrode 230 of FIG. 5.

Figure 6:
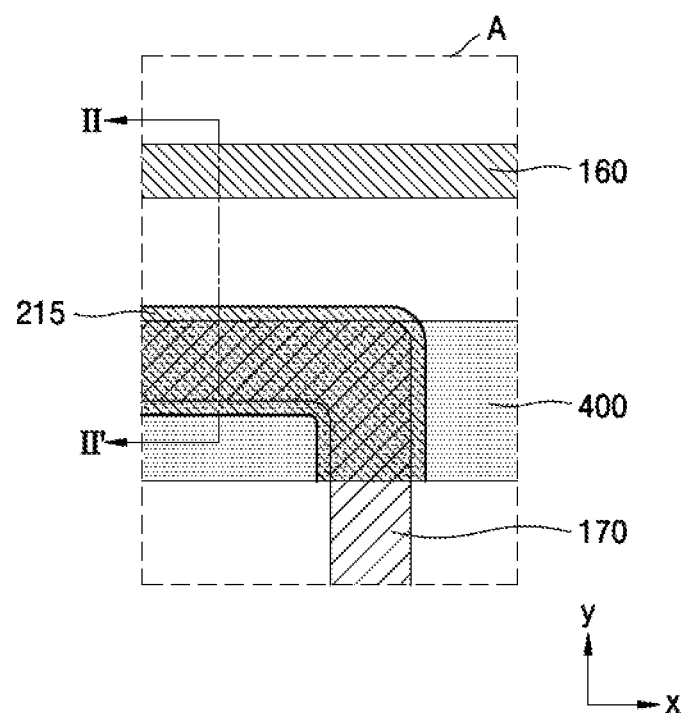
FIG. 6 is a plan view schematically illustrating an enlarged portion of a display device according to an exemplary embodiment.
Figure 7:
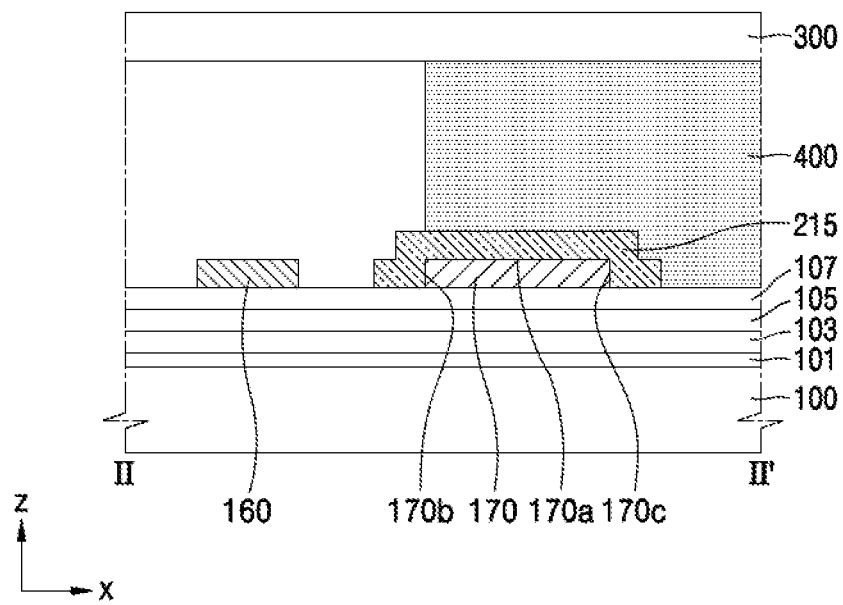
FIG. 7 is a cross-sectional view schematically illustrating a display device according to an exemplary embodiment.
Figure 8:
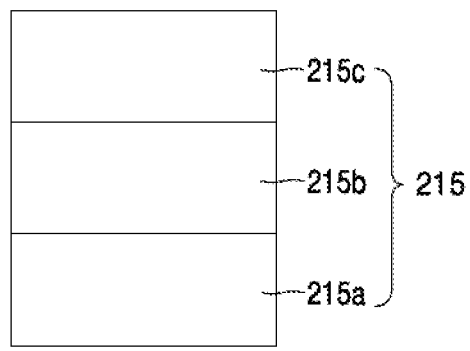
FIG. 8 is a cross-sectional view schematically illustrating a display device according to an exemplary embodiment.

FIG. 6 illustrates an enlarged portion of a display device according to an embodiment, FIG. 7 illustrates a cross-section of the display device according to the embodiment, and FIG. 8 illustrates a cross-section of the display device according to the embodiment. More specifically, FIG. 6 shows an enlarged view of a region A of FIG. 2, FIG. 7 corresponds to a cross-section taken along line II-II' of FIG. 6, and FIG. 8 shows a view illustrated in order to describe a stacked structure of a conductive layer 215 according to an embodiment.

Referring to FIG. 6, the display device according to the embodiment has an overlapping region in which the second power supply line 170 and the sealing portion 400 overlap each other in a portion of the non-display area NDA. In FIG. 6, the second power supply line 170 and the sealing portion 400 overlap each other, while the first power supply line 160 and the sealing portion 400 do not overlap. However, in another embodiment, the first power supply line 160 and the sealing portion 400 may overlap each other instead of or in addition to the second power supply line 170.

The conductive layer 215 may be arranged on the second power supply line 170. The conductive layer 215 may be arranged directly on the second power supply line 170 and may also directly contact the sealing portion 400.

In a non-preferred display device without conductive layer 215, the second power supply line 170 might be damaged by heat during laser sealing, and thus, a hillock or warping phenomenon might occur on the surface of the second power supply line 170, or a short-circuit might occur between the second power supply line 170 and the first power supply line 160.

In the present embodiment, in order to prevent the aforementioned hillock or warping and/or short-circuit, by placing the conductive layer 215 on the second power supply line 170, damage to the second power supply line 170 due to heat during laser sealing may be prevented, thereby preventing a hillock or warping phenomenon from occurring on the surface of the second power supply line 170 or preventing a short-circuit from occurring between the second power supply line 170 and the first power supply line 160, for example.

Referring to FIG. 7, the buffer layer 101, the first insulating layer 103, the second insulating layer 105, and the third insulating layer 107 may be arranged on the first substrate 100. A power supply line including the first power supply line 160 and the second power supply line 170 may be arranged on the third insulating layer 107. The first power supply line 160 and the second power supply line 170 may be arranged on the same layer and be spaced apart from each other and arranged on the third insulating layer 107.

Each of the first power supply line 160 and the second power supply line 170 may include a conductive material including Mo, Al, Cu, Ti, or the like and may include multiple layers or a single layer, which include the conductive material. The first power supply line 160 and the second power supply line 170 may include Al. In an embodiment, each of the first power supply line 160 and the second power supply line 170 may have a multilayer structure of Ti/Al/Ti. For example, the first power supply line 160 and the second power supply line 170 may include the same material as the source electrode 137 and the drain electrode 138.

The conductive layer 215 may be arranged on the power supply line. The conductive layer 215 may be arranged directly on the second power supply line 170, and may clad an upper surface 170a and both side surfaces 170b and 170c of the second power supply line 170. The conductive layer 215 may include at least one of Ag, Mg, Al, Pt, Pd, Au, Ni, Nd, Ir, and Cr. In addition, the conductive layer 215 may include at least one of ITO, IZO, ZnO, $In_2O_3$, IGO, and AZO.

Referring to FIG. 8, the conductive layer 215 may include a first layer 215a including ITO, a second layer 215b arranged on the first layer 215a and including Ag, and a third layer 215c arranged on the second layer 215b and including ITO. Therefore, the conductive layer 215 may have a stacked structure of ITO/Ag/ITO.

In an embodiment, the conductive layer 215 may include the same material as the pixel electrode 210 arranged in the display area DA, and may be formed on the second power supply line 170 at the same time during a process of forming the pixel electrode 210 on the pixel-defining layer 180. For example, the conductive layer 215 may be patterned on the second power supply line 170 at the same time during a process of patterning the pixel electrode 210 on the pixel-defining layer 180 without an additional process or mask.

As the conductive layer 215 is arranged on the second power supply line 170 and dads the upper surface 170a and the both side surfaces 170b and 170c of the second power supply line 170, damage to the second power supply line 170 due to heat during laser sealing may be prevented, thereby preventing a hillock or warping phenomenon from occurring on the surface of the second power supply line 170 or preventing a short-circuit from occurring between the second power supply line 170 and the first power supply line 160.

The sealing portion 400 and the second substrate 300 may be arranged on the conductive layer 215. In an embodiment, the sealing portion 400 may be arranged directly on the conductive layer 215 for bonding strength or the like. The sealing portion 400 may be arranged on the conductive layer 215 and have an overlapping region overlapping at least a portion of the second power supply line 170. The first substrate 100 and the second substrate 300 may be bonded together through the sealing portion 400. In this process, the sealing portion 400 overlapping the second power supply line 170 may be pressed toward the display area DA, and thus, the first power supply line 160 and the sealing portion 400 may at least partially overlap each other.

Figure 9:
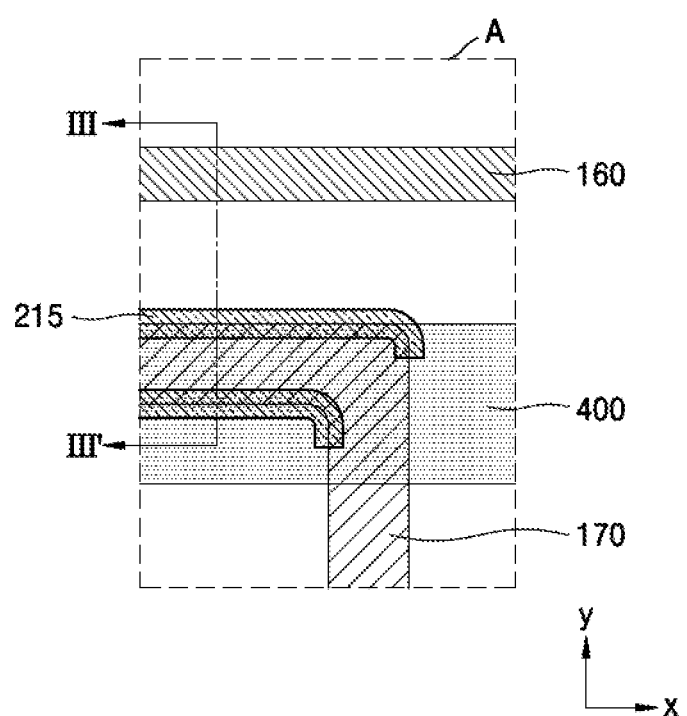
FIG. 9 is a plan view schematically illustrating an enlarged portion of a display device according to an exemplary embodiment.
Figure 10:
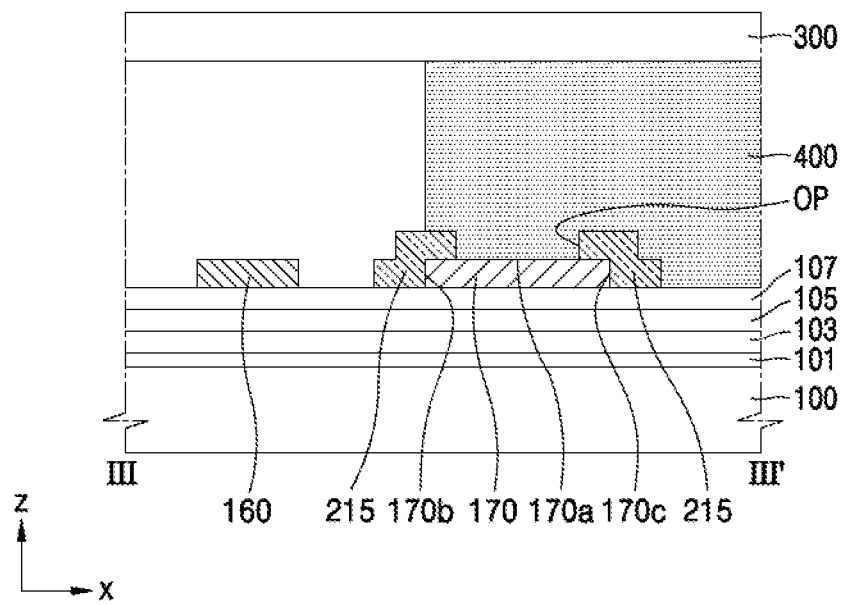
FIG. 10 is a cross-sectional view schematically illustrating an enlarged portion of a display device according to an exemplary embodiment.

FIG. 9 illustrates an enlarged portion of a display device according to an embodiment, and FIG. 10 illustrates an enlarged portion of the display device according to the embodiment. The embodiment of FIGS. 9 and 10 differs from the above-described embodiment in the structure of the conductive layer 215 arranged on the second power supply line 170. Hereinafter, differences between the conductive layer 215 arranged on the second power supply line 170 and that of the above-described embodiment will be primarily addressed, so repeated description may be omitted.

Referring to FIGS. 9 and 10, a power supply line of the display device according to the embodiment may include a first power supply line 160 and a second power supply line 170. The first power supply line 160 and the second power supply line 170 may be spaced apart from each other and may be arranged on the same layer.

A conductive layer 215 may be arranged on the second power supply line 170. The conductive layer 215 may be arranged on the second power supply line 170 and may clad at least a portion of an upper surface 170a of the second power supply line 170 and both side surfaces 170b and 170c thereof. For example, the conductive layer 215 may include an opening OP exposing at least a portion of the upper surface 170a of the second power supply line 170.

As the conductive layer 215 is arranged on the second power supply line 170 and dads at least a portion of the upper surface 170a of the second power supply line 170 and the both side surfaces 170b and 170c thereof, damage to the second power supply line 170 due to heat during laser sealing may be prevented, thereby preventing a hillock or warping phenomenon from occurring on the surface of the second power supply line 170 or preventing a short-circuit from occurring between the second power supply line 170 and the first power supply line 160.

A sealing portion 400 and a second substrate 300 may be arranged on the conductive layer 215. In an embodiment, the sealing portion 400 may be arranged directly on the conductive layer 215 to promote bonding strength or the like. The sealing portion 400 may be arranged on the conductive layer 215 and have an overlapping region overlapping at least a portion of the second power supply line 170. For example, the sealing portion 400 may directly contact the second power supply line 170 through the opening OP defined in the conductive layer 215. The first substrate 100 and the second substrate 300 may be bonded together through the sealing portion 400. In this process, the sealing portion 400 overlapping the second power supply line 170 may be pressed toward the display area DA, and thus, the first power supply line 160 and the sealing portion 400 may at least partially overlap each other.

Figure 11:
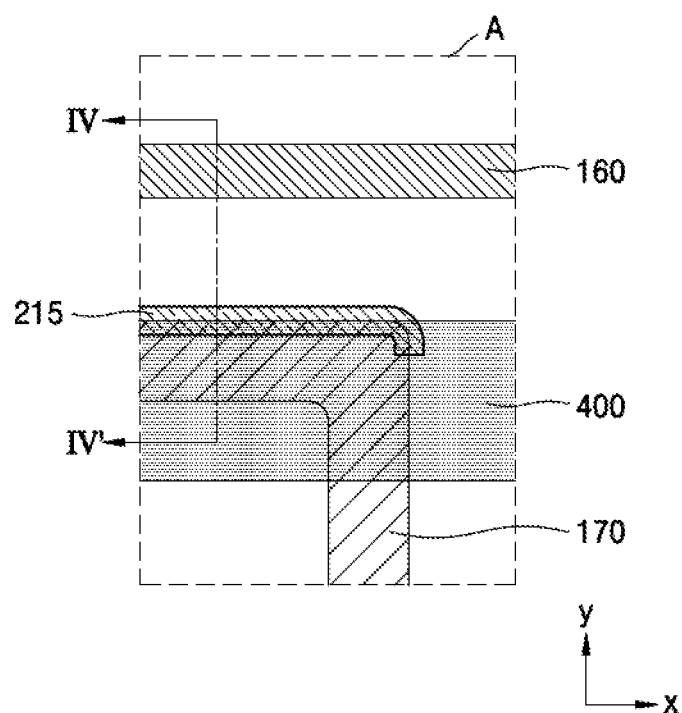
FIG. 11 is a plan view schematically illustrating an enlarged portion of a display device according to an exemplary embodiment.
Figure 12:
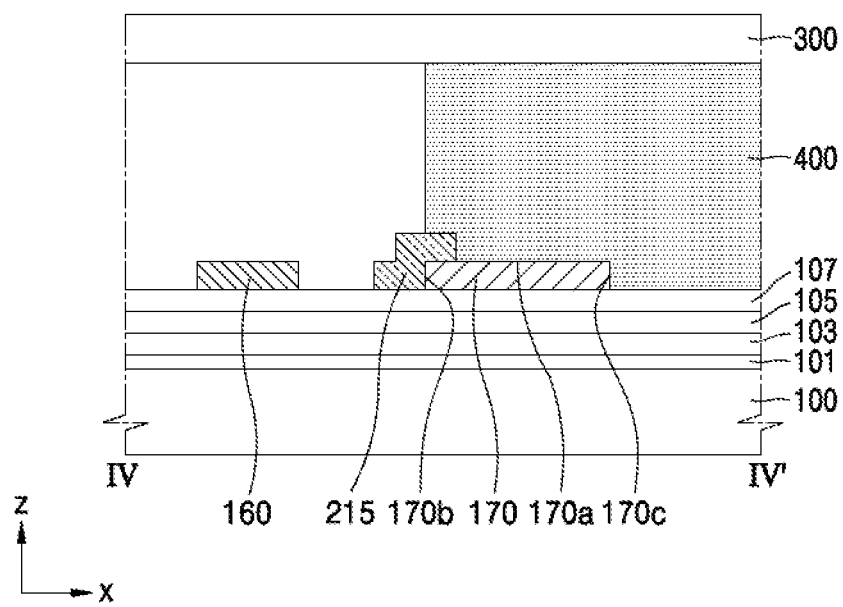
FIG. 12 is a cross-sectional view schematically illustrating an enlarged portion of a display device according to an exemplary embodiment.

FIG. 11 illustrates an enlarged portion of a display device according to an embodiment, and FIG. 12 illustrates a cross-section of an enlarged portion of the display device according to the embodiment. The embodiment of FIGS. 11 and 12 differs from the above-described embodiment in the structure of the conductive layer 215 arranged on the second power supply line 170. Hereinafter, differences between the conductive layer 215 arranged on the second power supply line 170 and that of the above-described embodiment will be primarily addressed, so repeated description may be omitted.

Referring to FIGS. 11 and 12, a power supply line of the display device according to the embodiment may include a first power supply line 160 and a second power supply line 170. The first power supply line 160 and the second power supply line 170 may be spaced apart from each other and may be arranged on the same layer.

A conductive layer 215 may be arranged on the second power supply line 170. The conductive layer 215 may be arranged on the second power supply line 170 and clad at least a portion of an upper surface 170a of the second power supply line 170 and a side surface 170b adjacent to the first power supply line 160.

As the conductive layer 215 is arranged on the second power supply line 170 and dads at least a portion of the upper surface 170a of the second power supply line 170 and the side surface 170b adjacent to the first power supply line 160, damage to the second power supply line 170 due to heat during laser sealing may be prevented, thereby preventing a hillock or warping phenomenon from occurring on the surface of the second power supply line 170 or preventing a short-circuit from occurring between the second power supply line 170 and the first power supply line 160.

The sealing portion 400 and the second substrate 300 may be arranged on the conductive layer 215. In an embodiment, the sealing portion 400 may be arranged directly on the conductive layer 215 for bonding strength or the like. The sealing portion 400 may be arranged on the conductive layer 215 and have an overlapping region overlapping at least a portion of the second power supply line 170. For example, the sealing portion 400 may directly contact the second power supply line 170 at least partially exposed. The first substrate 100 and the second substrate 300 may be bonded together through the sealing portion 400. In this process, the sealing portion 400 overlapping the second power supply line 170 may be pressed toward the display area DA, and thus, the first power supply line 160 and the sealing portion 400 may at least partially overlap each other.

According to the embodiments described above, in order to optimize laser sealing after the first substrate 100 and the second substrate 300 are bonded together, and prevent at least one of the power supply lines from being damaged by heat, pressure, and/or shearing forces such as encountered during laser-irradiated bonding to cause a hillock or warping phenomenon or a short-circuit between adjacent wiring lines, a conductive layer is formed on the power supply line by using the same or similar material as a material forming the pixel electrode 210, and the same or similar process as a process of forming the pixel electrode 210, to clad the power supply line, and thus, a display device, which resists the occurrence of a hillock or warping phenomenon or a short-circuit between adjacent wiring lines may have improved yield and/or reliability.

It shall be understood that while the present exemplary embodiment emphasizes protection for power lines, that the teachings herein may be applied to any conductive, metallic and/or signal lines in a sealing area. Although a display device has been primarily described, the present disclosure is not limited thereto. For example, a method of manufacturing the type of display device described above is also within the scope of the present disclosure.

As described above, according to exemplary embodiments of the present disclosure, a display device is implemented by cladding a power supply line with a conductive layer or line, which may prevent a short-circuit between adjacent wiring lines and thus offer high reliability. However, the scope of the present disclosure is not limited thereto.

It shall be understood that embodiments described herein are to be considered in a descriptive sense and not for purposes of limitation. Descriptions of features or aspects within each embodiment should be considered as available for interchange with other similar features or aspects in other embodiments. While one or more embodiments have been described with reference to the figures, it will be understood by those of ordinary skill in the pertinent art that various changes in form and details may be made therein without departing from the scope or spirit of the present disclosure as defined by the following claims.

What is claimed is:

1. A display device comprising:
a first substrate having a display area and a non-display area on one side of the display area;
a second substrate arranged opposite the first substrate;
a display element arranged on the display area, the display element including a pixel electrode, an intermediate layer arranged on the pixel electrode, and an opposite electrode arranged on the intermediate layer;
at least one power supply line arranged on the non-display area, the at least one power supply line comprising a first power supply line adjacent to the display area and supplying a first power supply voltage to a driving voltage line for the pixel electrode, and a second power supply line adjacent to the first power supply line and supplying a second power supply voltage to the opposite electrode;
a conductive layer directly arranged on at least a portion of the second power supply line between the first power supply line and the second power supply line and including the same material as the pixel electrode; and
a sealing portion disposed on the second power supply line adjacent to the conductive layer in the non-display area,
wherein the conductive layer clads at least a portion of an upper surface of the second power supply line,
wherein the conductive layer clads a first side surface of the second power supply line and wherein the first side surface of the second power supply line is adjacent to the first power supply line, and
wherein the conductive layer exposes a second side surface of the second power supply line and wherein the second side surface of the second power supply line is located opposite to the first side surface of the second power supply line.

2. The display device of claim 1, wherein the conductive layer is arranged directly on the second power supply line.

3. The display device of claim 1, wherein the sealing portion that bonds the first substrate and the second substrate to each other, the sealing portion being arranged in the non-display area to surround a periphery of the display area.

4. The display device of claim 3, wherein the sealing portion at least partially overlaps the second power supply line.

5. The display device of claim 3, wherein the sealing portion directly contacts the conductive layer contiguously with the second power supply line.

6. The display device of claim 1, wherein the at least one power supply line comprises at least one of molybdenum (Mo), aluminum (Al), copper (Cu), and titanium (Ti).

7. The display device of claim 1, wherein the conductive layer comprises at least one of silver (Ag), magnesium (Mg), aluminum (Al), platinum (Pt), palladium (Pd), gold (Au), nickel (Ni), neodymium (Nd), iridium (Ir), and chromium (Cr).

8. The display device of claim 7, wherein the conductive layer comprises at least one of indium tin oxide (ITO), indium zinc oxide (IZO), zinc oxide (ZnO), indium oxide ($In_2O_3$), indium gallium oxide (IGO), and aluminum zinc oxide (AZO).

9. The display device of claim 8, wherein the conductive layer has a stacked structure of ITO/Ag/ITO.

10. A display device comprising:
a first substrate having a display area and a non-display area on one side of the display area;
a second substrate arranged opposite the first substrate;
a display element arranged on the display area, the display element including a pixel electrode, an intermediate layer arranged on the pixel electrode, and an opposite electrode arranged on the intermediate layer;
at least one power supply line arranged on the non-display area, the at least one power supply line comprising a first power supply line supplying a first power supply voltage to a driving voltage line for the pixel electrode and a second power supply line supplying a second power supply voltage to the opposite electrode;
a conductive layer directly arranged on the second power supply line between the first power supply line and the second power supply line and including the same material as the pixel electrode; and
a sealing portion that bonds the first substrate and the second substrate to each other, the sealing portion being arranged in the non-display area to surround a periphery of the display area,
wherein the conductive layer clads at least a portion of an upper surface of the second power supply line,
wherein the conductive layer clads a first side surface of the second power supply line and wherein the first side surface of the second power supply line is adjacent to the first power supply line, and
wherein the conductive layer exposes a second side surface of the second power supply line and wherein the second side surface of the second power supply line is located opposite to the first side surface of the second power supply line.

11. The display device of claim 10, wherein the sealing portion at least partially overlaps the second power supply line.

12. The display device of claim 11, wherein the sealing portion directly contacts the conductive layer contiguously with the second power supply line.

13. The display device of claim 10, wherein the at least one power supply line comprises at least one of Mo, Al, Cu, and Ti.

14. The display device of claim 10, wherein the conductive layer has a stacked structure of ITO/Ag/ITO.

* * * * *